United States Patent
Ng et al.

(10) Patent No.: US 8,633,089 B2
(45) Date of Patent: Jan. 21, 2014

(54) DIE BONDING METHOD UTILIZING ROTARY WAFER TABLE

(75) Inventors: Man Chung Ng, Kwai Chung (HK); Keung Chau, Kwai Chung (HK)

(73) Assignee: ASM Assembly Automation Ltd, Hong Kong (HK)

( * ) Notice: Subject to any disclaimer, the term of this patent is extended or adjusted under 35 U.S.C. 154(b) by 270 days.

(21) Appl. No.: 13/072,869

(22) Filed: Mar. 28, 2011

(65) Prior Publication Data

US 2012/0252161 A1    Oct. 4, 2012

(51) Int. Cl.
  *H01L 21/00*    (2006.01)
  *H01L 21/30*    (2006.01)
  *H01L 21/46*    (2006.01)
  *H01L 21/66*    (2006.01)

(52) U.S. Cl.
  USPC ............... 438/458; 438/33; 438/68; 438/110; 438/113; 438/114; 257/E21.567; 257/E21.599

(58) Field of Classification Search
  USPC ..................... 438/33, 68, 110, 113, 114, 458; 257/E21.567, E21.599
  See application file for complete search history.

(56) References Cited

U.S. PATENT DOCUMENTS

| | | | |
|---|---|---|---|
| 5,765,277 A * | 6/1998 | Jin et al. | 29/743 |
| 6,223,800 B1 * | 5/2001 | Kim et al. | 156/556 |
| 2009/0283220 A1 * | 11/2009 | Chen | 156/566 |
| 2010/0078125 A1 * | 4/2010 | Fujino et al. | 156/285 |
| 2010/0089980 A1 * | 4/2010 | Maeda | 228/199 |
| 2010/0313415 A1 * | 12/2010 | Chan et al. | 29/874 |
| 2011/0215134 A1 * | 9/2011 | Sim | 228/101 |

* cited by examiner

*Primary Examiner* — Mohsen Ahmadi
(74) *Attorney, Agent, or Firm* — Ostrolenk Faber LLP

(57) ABSTRACT

An array of semiconductor components, comprising a first plurality of semiconductor components and a second plurality of semiconductor components held on a carrier, is bonded onto one or more substrates. The first plurality of semiconductor components is first located for pick-up by a transfer device, and each semiconductor component comprised in the first plurality of semiconductor components is picked up with the transfer device and is bonded onto a respective bonding position on the one or more substrates. After the first plurality of semiconductor components have been picked up and bonded, the carrier is rotated and the second plurality of semiconductor components is located for pick-up by the transfer device. Thereafter, each semiconductor component comprised in the second plurality of semiconductor components is picked up with the transfer device and is bonded onto a respective bonding position on the one or more substrates.

12 Claims, 6 Drawing Sheets

DIE BONDING METHOD UTILIZING ROTARY WAFER TABLE

FIELD OF THE INVENTION

The invention relates to semiconductor die bonding, and in particular, to methods of transferring semiconductor dice from one location to another.

BACKGROUND AND PRIOR ART

In a die bonding apparatus a silicon wafer is supported on a carrier such as a wafer table. The wafer is generally circular and is made up of a large number of electronic components or dice which are arranged in a matrix. The dice are picked up from the wafer table by a pick-and-place device which transfers the dice individually from the wafer to bonding positions comprising respective bond pads on a substrate such as a leadframe.

Conventionally, the dice are picked up from a fixed pick-up position and then transferred to a bonding position on a substrate. The wafer is supported on a movable wafer table which re-positions the wafer so that each die may be picked up by the pick-and-place device from the pick-up position. The wafer table is adapted to move the wafer in mutually orthogonal X and Y directions, and to achieve maximum speed, the wafer table is adapted to move in both the X and Y directions simultaneously. In this way any die on the wafer can be moved to the pick-up position for die pick-up. Such conventional designs have disadvantages with the introduction of larger wafers that are becoming more common in the field.

One factor affecting throughput is the travel distance of the pick-and-place device between the pick-up position and the bonding position, and throughput is generally affected by the size of the wafer. For example, to move a die on a 6-inch diameter wafer to the pick-up position, the wafer table must have a range of travel of at least 6 inches in both the X and Y directions. This distance increases with larger wafers so that more time is required to transfer dice from a larger wafer to substrates for bonding. Therefore, throughput is reduced when the wafers are larger. The footprint of the wafer table must also be increased to provide sufficient space for the translational displacement of the wafers which is dependent on the locus of its working area. As a result, the die bonding apparatus is also larger.

FIG. 1 illustrates a conventional die bonding apparatus with a conventional die transfer system 100. A wafer table supporting a wafer 101 with singulated dice 102 is movable along X and Y directions to move each die 102 to a fixed die pick-up position 108. A die transfer device 104 includes a die pick tool 106 to pick up a die 102 from a die pick-up point 108 to a bonding point 110 on a substrate 112. The substrate 112 is indexed along a substrate holder 114 to position respective bond pads to the bonding point 110 to receive the dice 102. Each die 102 is moved to the die pick-up point 108 by moving the wafer 101 within a locus 116 or working area in order to move each die 102 on a wafer 101 of diameter D. The minimum travel distance of the die pick tool 106 from the die pick-up point 108 to the side of the substrate holder 114 closest to the wafer table is at least greater than D and the working envelope or area required for movement by the wafer table is 2D.

SUMMARY OF THE INVENTION

Thus, it is an object of the invention to seek to provide a die bonding method which provides improved throughput and smaller footprint as compared to the prior art described above.

Accordingly, the invention provides a method of bonding an array of semiconductor components onto one or more substrates, comprising the steps of: providing a first plurality of semiconductor components and a second plurality of semiconductor components on a carrier; locating the first plurality of semiconductor components for pick-up by a transfer device; picking up each semiconductor component comprised in the first plurality of semiconductor components with the transfer device and bonding it onto a respective bonding position on the one or more substrates; after the first plurality of semiconductor components have been picked up and bonded, rotating the carrier and locating the second plurality of semiconductor components for pick-up by the transfer device; and thereafter picking up each semiconductor component comprised in the second plurality of semiconductor components with the transfer device and bonding it onto a respective bonding position on the one or more substrates It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus and method in accordance with the invention will now be described with reference to the accompanying drawings, in which.

DETAILED DESCRIPTION OF THE PREFERRED EMBODIMENT OF THE INVENTION

Figure 1:
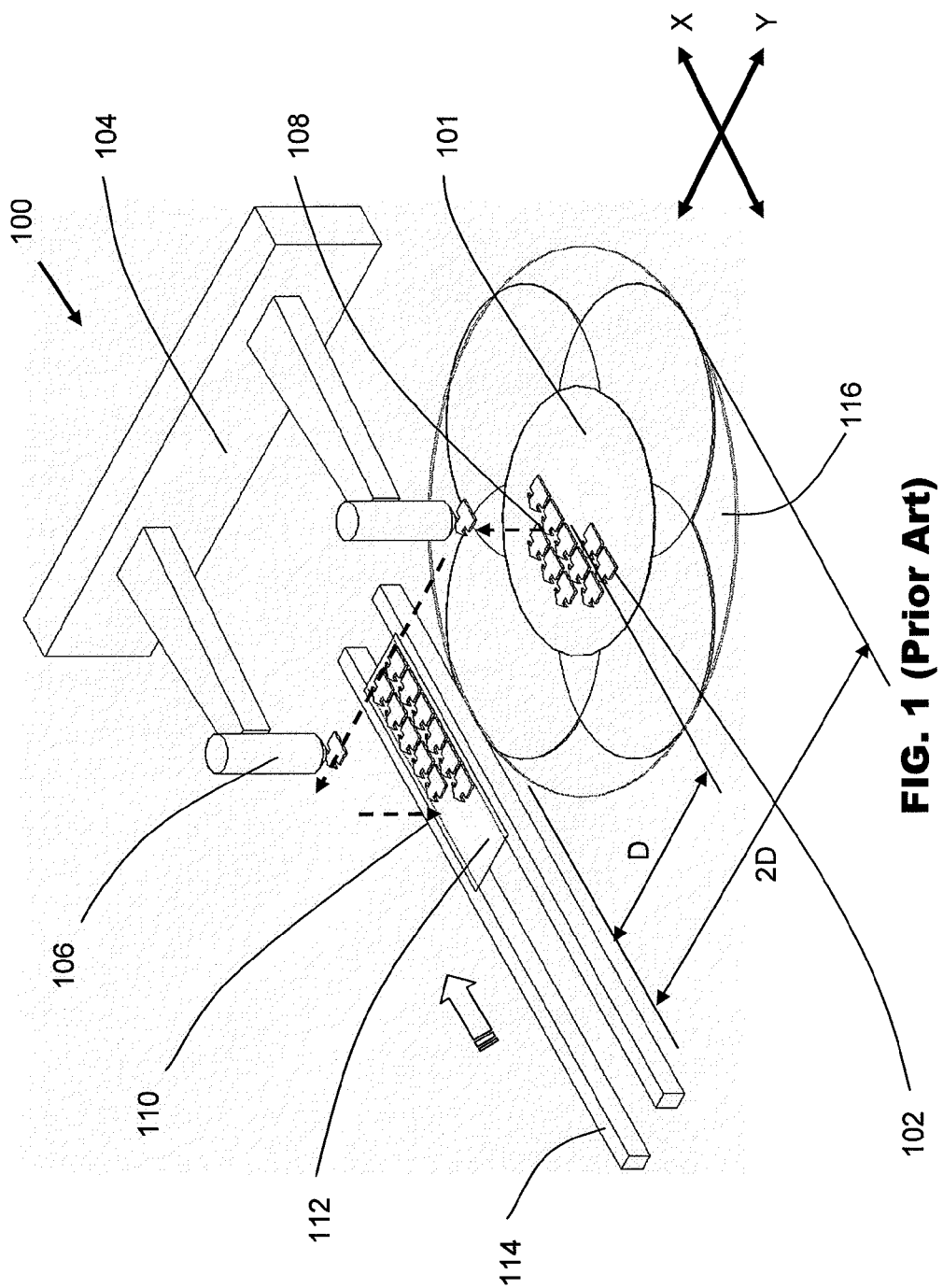
FIG. 1 illustrates a conventional die bonding apparatus with a conventional die transfer system.
Figure 2:
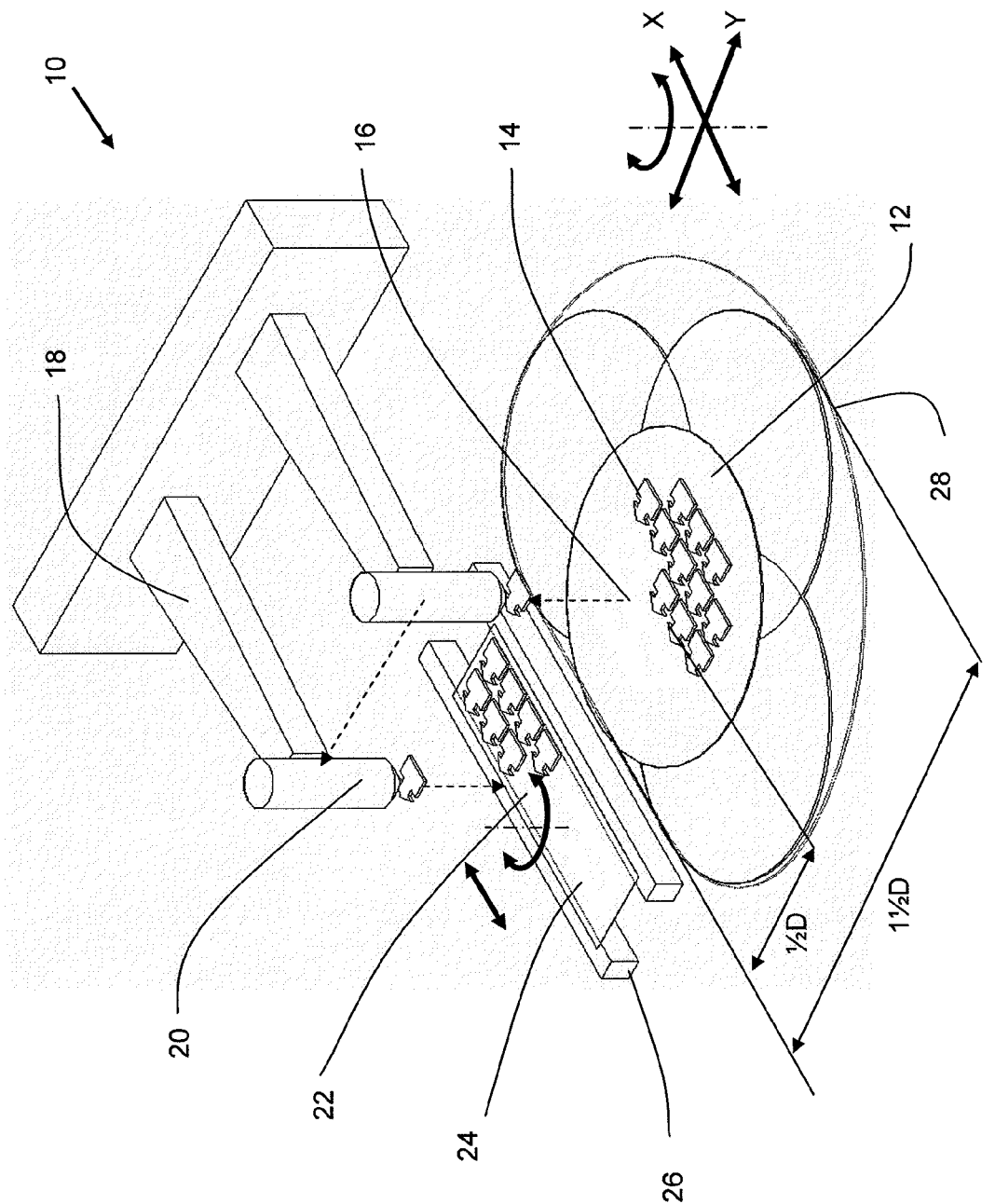
FIG. 2 is a perspective view of a die bonding apparatus incorporating a die transfer system according to the preferred embodiment of the invention.

FIG. 2 is a perspective view of a die bonding apparatus incorporating a die transfer system 10 according to the preferred embodiment of the invention. A carrier such as a wafer table supports a plurality of semiconductor components, which may be in the form of a circular wafer 12 with singulated dice 14. The singulated dice 14 are arranged in an array. The wafer table is operable to move a die to a die pick-up point 16 by a combination of translational and/or rotational motion. The die pick-up point 16 is preferably fixed.

A die transfer device 18 includes a die pick tool 20 to pick up a die 14 from the die pick-up point 16 before it moves the die pick tool 20 to a bonding position 22 on a substrate 24 supported on a substrate holder 26 in order to bond the die 14. The semiconductor components or dice 14 may be bonded onto one or more substrates 24 which are supported on the substrate holder 26. The die transfer device 18 may also be in the form of a rotary tool operating either solely by rotational motion or combining both linear and rotational motions to transfer a target die 14 from the die pick-up point 16 to the bonding position 22.

The substrate 24 is conveyed and indexed on the substrate holder 26 along the X-axis to position a bond pad to the bonding position 22 for receiving a die 14. The substrate holder 26 is also rotatable on the horizontal X-Y plane, preferably by up to 180 degrees in each rotational direction, so as to correct the orientation of the substrate 24 relative to the die 14 before bonding the die 14 onto the substrate 24.

Each die 14 on the wafer 12 is moved to the die pick-up point 16 by translational and/or rotational motion of the wafer 12 within a locus 28 or working area to position each die 14 on the wafer 12 having diameter D to the die pick-up point 16. The pick-up point 16 is locatable nearer to the substrate holder 26 by a distance of at least ½ D as compared to the prior art. Therefore, the travel distance of the die transfer device 18 is reduced from at least D in the prior art to at least ½ D.

Figure 3A:
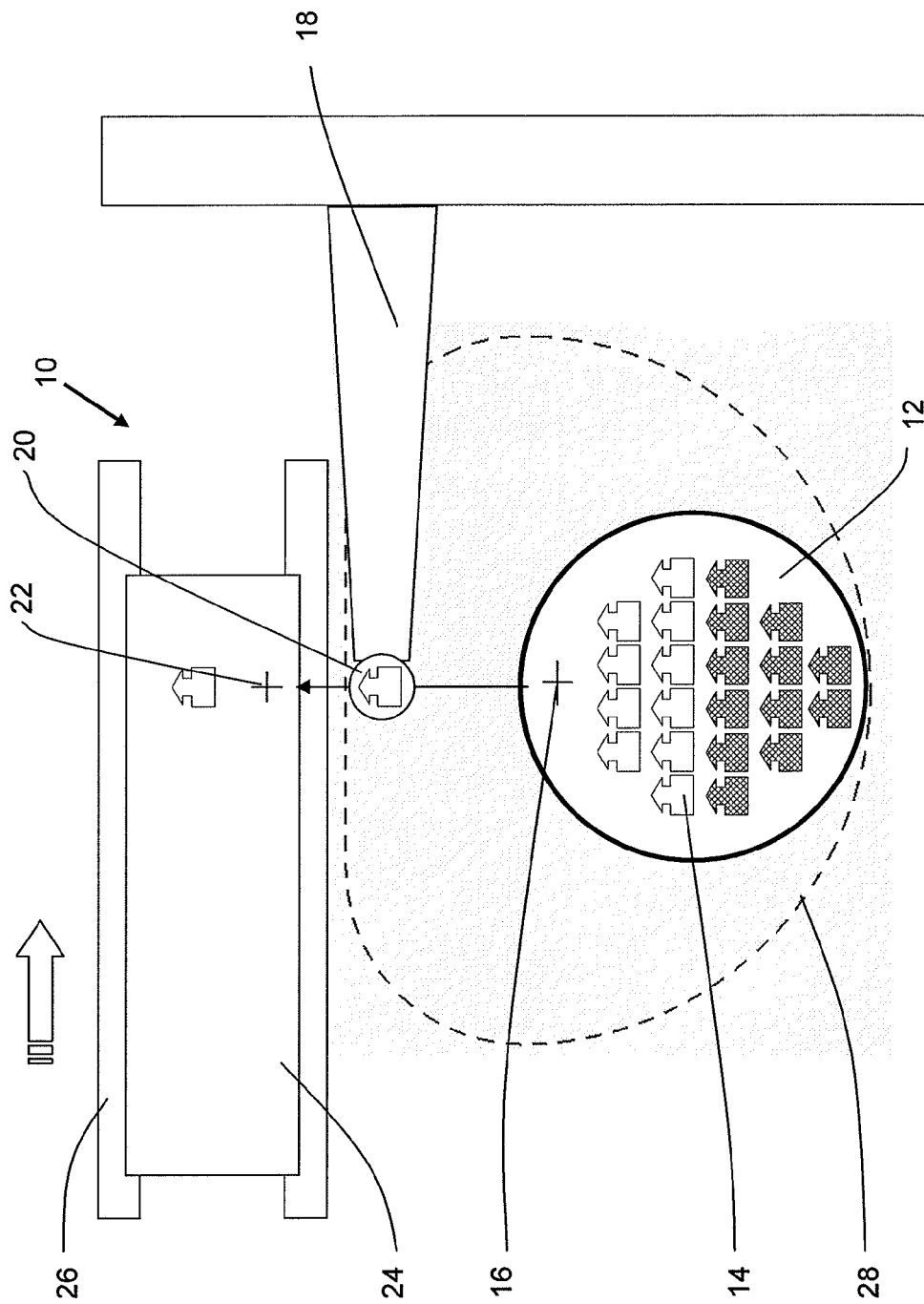
FIGS. 3(a) to 3(c) are plan views of the die transfer system of FIG. 2 illustrating a pick-and-bond operation according to a first preferred embodiment of the invention.
Figure 3B:
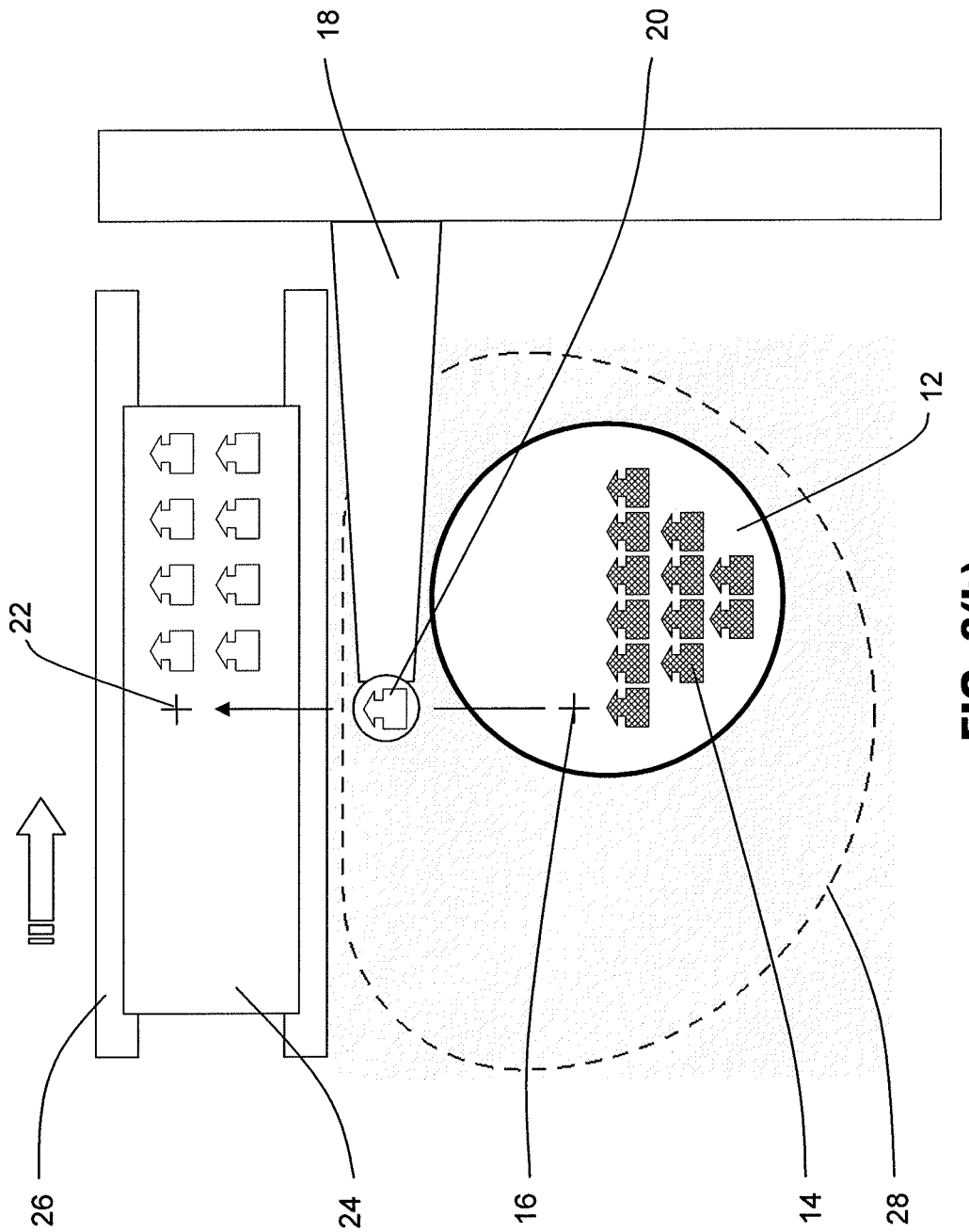
Figure 3C:
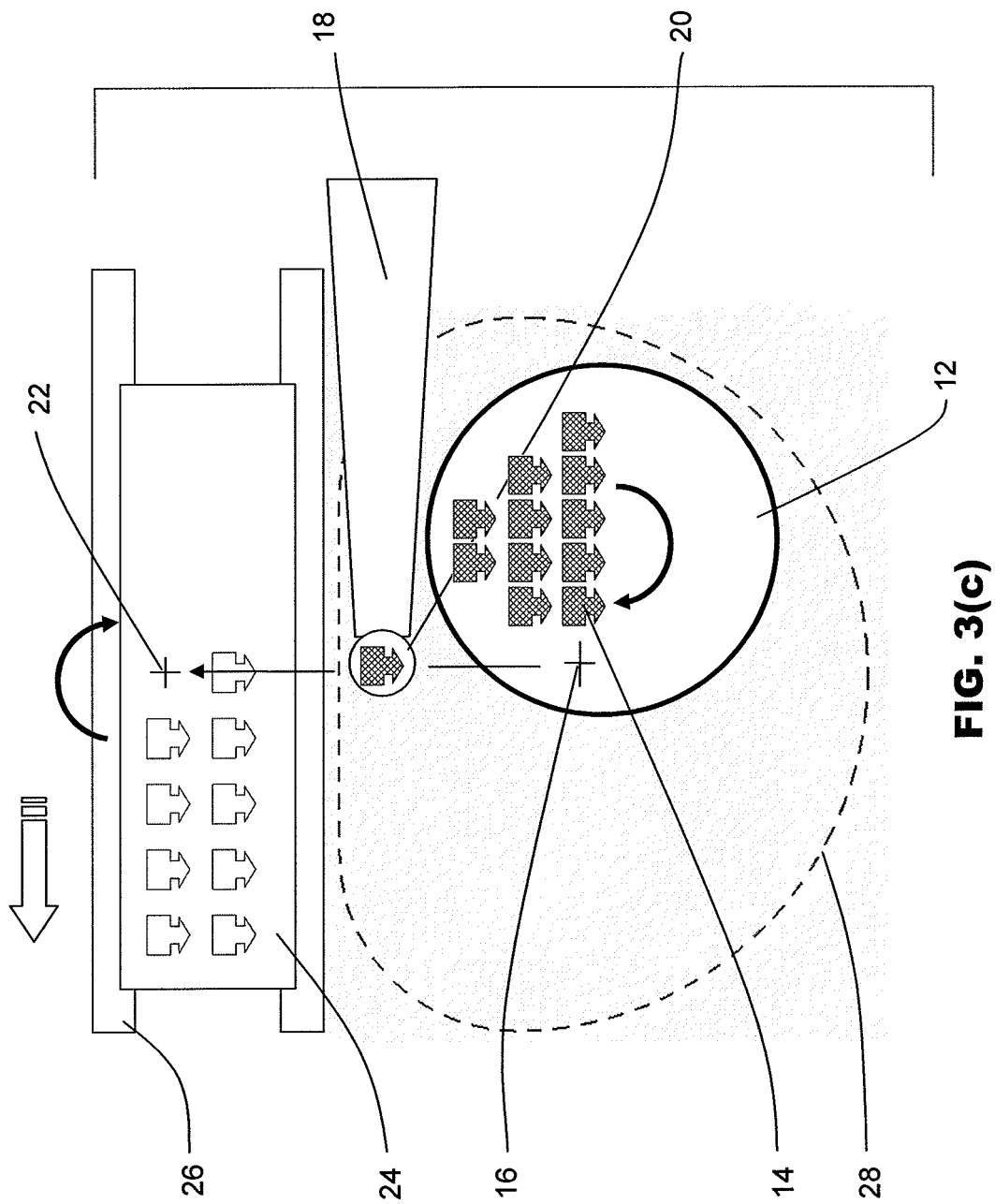

FIGS. 3(a) to 3(c) are plan views of the die transfer system 10 of FIG. 2 illustrating a pick-and-bond operation according to a first preferred embodiment of the invention. FIG. 3(a) shows the pick-and-bond operation for a first plurality of dice 14 extending for a first half of the wafer 12 located nearest to the substrate holder 26. The die transfer device 18 travels a distance of at least ½ D to relocate each die 14 from the pick-up point 16 to the bonding position 22, and to bond the die 14 onto a respective bonding position on the substrate 24. The locus 28 of the wafer table when it moves and repositions the wafer 12 to locate each die in the first half of the wafer 12 of diameter D to the pick-up point 16 is illustrated in dotted lines.

In FIG. 3(b), all the dice 14 in the first half of the wafer 12 have been re-located to the substrate 24 which has also been indexed to position each bond pad to the bonding point 22 to receive the corresponding die 14. The wafer 12 has been shifted a distance ½ D towards the substrate holder 26 at the time when the dice 14 located in the last remaining row in the first half of the dice 14 are transferred to the substrate 24.

FIG. 3(c) shows the wafer 12 after it has been rotated by 180 degrees by the wafer table to reposition a second plurality of dice 14 extending for a second half of the wafer 12 adjacent to the substrate holder 26 for subsequent pick-up at the pick-up point 16. The second plurality of dice 14 preferably comprises substantially the same number of dice 14 as the first plurality of dice.

At the same time, the substrate holder 26 is rotated by the same angle that the wafer tale was rotated, i.e. 180 degrees, so that bond pads corresponding to the dice 14 in the second half of the wafer may be located to the bonding point 22 to receive the respective die 14. Rotating the substrate holder 26 also aligns the orientation of the dice 14 on the wafer 12 with the required orientation of the dice to be bonded onto the substrate 24. Hence, the traveling distance of the wafer table as well as the working area for the die transfer system 10 can be reduced. Thereafter, the transfer device 18 bonds each die 14 from the second plurality of dice 14 onto a respective bonding position 22 on the substrate 24.

Figure 4:
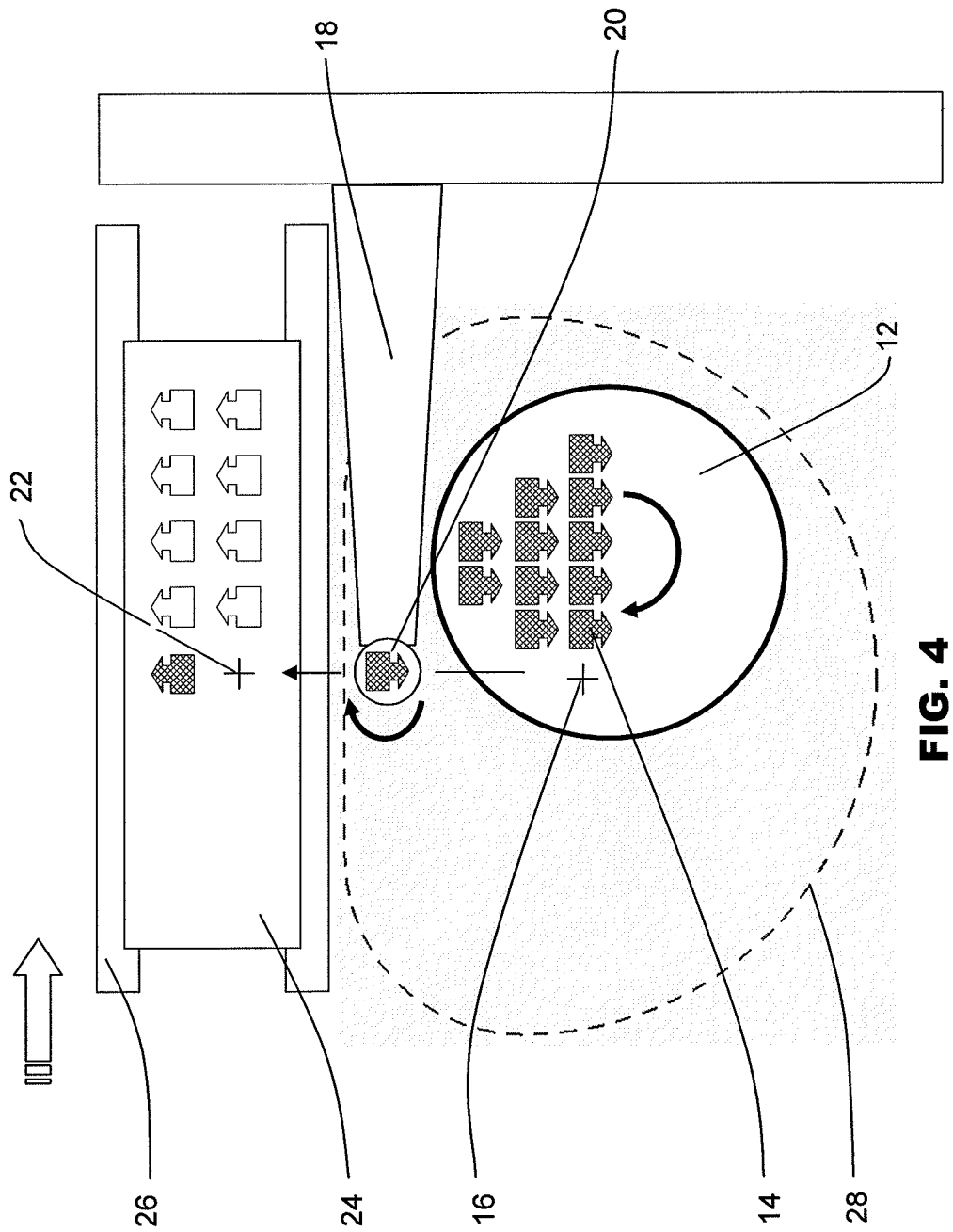
FIG. 4 is a plan view of the die transfer system of FIG. 2 illustrating a pick-and-bond operation according to a second preferred embodiment of the invention.

FIG. 4 is a plan view of the die transfer system 10 of FIG. 2 illustrating a pick-and-bond operation according to a second preferred embodiment of the invention. The wafer 12 has been rotated 180 degrees by the wafer table to reposition the second half of dice 14 on the wafer 12 next to the substrate holder 26 for subsequent pick-up at the pick-up point 16. Unlike the first pick-and-bond operation wherein the substrate holder 26 is rotatable and is rotated by 180 degrees to align the bond pads with the dice 14 in the second half of the wafer before bonding, the die pick tool 20 comprises a rotary tool that is rotatable to change the orientation of each die 14 picked from the second half of wafer 12 so that it is in the correct orientation for bonding onto the substrate 24. The traveling distance of the wafer table and the die transfer device 18 as well as the working area for the wafer table is reduced by substantially the same amount as with the pick-and-bond operation according to the first preferred embodiment of the invention.

It should be appreciated that the invention helps to reduce the travel distance of the die transfer device 18 from the pick-up point 16 to the bonding point 22 by about half of the wafer diameter to ½ D and the locus 28 of each working area is smaller than in the prior art. As a result, the footprint of the die bonding apparatus for larger wafers can be reduced and the throughput of the transfer process is increased.

The invention described herein is susceptible to variations, modifications and/or additions other than those specifically described and it is to be understood that the invention includes all such variations, modifications and/or additions which fall within the spirit and scope of the above description.

The invention claimed is:

1. Method of bonding an array of semiconductor components onto one or more substrates, comprising the steps of:
    providing a first plurality of semiconductor components and a second plurality of semiconductor components on a carrier;
    locating the first plurality of semiconductor components for pick-up by a transfer device;
    picking up each semiconductor component comprised in the first plurality of semiconductor components with the transfer device and bonding it onto a respective bonding position on the one or more substrates;
    after the first plurality of semiconductor components have been picked up and bonded, rotating the carrier through an angle and locating the second plurality of semiconductor components for pick-up by the transfer device; and thereafter
    picking up each semiconductor component comprised in the second plurality of semiconductor components with the transfer device;
    rotating a pick tool of the transfer device to change the orientation of the semiconductor component relative to the substrate after picking up each semiconductor component comprised in the second plurality of semiconductor components, but before bonding it onto a respective bonding position; and
    bonding each semiconductor component comprised in the second plurality of semiconductor components onto a respective bonding position on the one or more substrates.

2. Method as claimed in claim 1, wherein the semiconductor components comprise semiconductor dice of a circular semiconductor wafer, and the semiconductor dice are arranged in an array.

3. Method as claimed in claim 2, wherein the first plurality of semiconductor dice extends for a first half of the wafer, and the second plurality of semiconductor dice extends for a second half for the wafer.

4. Method as claimed in claim 3, wherein all the semiconductor dice comprised in the first half of the wafer are picked up before the carrier is rotated.

5. Method as claimed in claim 1, wherein the semiconductor components are picked from a fixed pick-up point, and picking up each semiconductor component further comprises the step of moving said semiconductor component to the fixed pick-up point by translational and/or rotational motion of the carrier.

6. Method as claimed in claim 1, wherein the one or more substrates are supported on a substrate holder which is rotatable to change an orientation of the substrate relative to the semiconductor components.

7. Method as claimed in claim 6, wherein after the step of rotating the carrier, the substrate holder is rotated by a same angle that the carrier was rotated.

8. Method as claimed in claim 7, wherein the substrate holder is rotated by up to 180 degrees on a horizontal plane.

9. Method as claimed in claim 1, wherein the first plurality of semiconductor components and the second plurality of semiconductor components each comprises substantially the same number of semiconductor components.

10. Method as claimed in claim 1, wherein the carrier is rotated by 180 degrees.

11. Method as claimed in claim 1, wherein the pick tool is rotated by a same angle that the carrier was rotated.

12. Method as claimed in claim 1, wherein the transfer device is rotated by 180 degrees.

* * * * *